(12) United States Patent
Santurkar et al.

(10) Patent No.: US 7,855,574 B2
(45) Date of Patent: Dec. 21, 2010

(54) PROGRAMMABLE MULTIPLE SUPPLY REGIONS WITH SWITCHED PASS GATE LEVEL CONVERTERS

(75) Inventors: Vikram Santurkar, Fremont, CA (US);
Ravi Thiruveedhula, Santa Clara, CA (US); Hyun Yi, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 399 days.

(21) Appl. No.: 11/548,206

(22) Filed: Oct. 10, 2006

(65) Prior Publication Data

US 2008/0094105 A1    Apr. 24, 2008

(51) Int. Cl.
*H03K 19/094* (2006.01)
(52) U.S. Cl. .......................... 326/68; 326/81
(58) Field of Classification Search .............. 326/68, 326/82, 80, 81, 38
See application file for complete search history.

(56) References Cited

U.S. PATENT DOCUMENTS

| | | | | |
|---|---|---|---|---|
| 4,506,164 A * | 3/1985 | Higuchi | ................. | 326/81 |
| 4,926,070 A * | 5/1990 | Tanaka et al. | ................ | 326/81 |
| 5,742,183 A * | 4/1998 | Kuroda | ................. | 326/81 |
| 5,801,551 A * | 9/1998 | Lin | ................. | 326/113 |
| 5,894,230 A * | 4/1999 | Voldman | ................. | 326/86 |
| 6,255,850 B1 * | 7/2001 | Turner | ................. | 326/81 |
| 6,380,570 B1 * | 4/2002 | Voldman | ................. | 257/288 |
| 6,940,307 B1 * | 9/2005 | Liu et al. | ................. | 326/38 |
| 7,183,800 B1 * | 2/2007 | Rahim et al. | ................. | 326/38 |
| 7,196,542 B1 * | 3/2007 | Lee et al. | ................. | 326/38 |
| 7,400,167 B2 * | 7/2008 | Lewis et al. | ................. | 326/38 |
| 2007/0008004 A1 * | 1/2007 | Santurkar et al. | ................. | 326/82 |

* cited by examiner

*Primary Examiner*—Vibol Tan
*Assistant Examiner*—Crystal L Hammond
(74) *Attorney, Agent, or Firm*—Martine Penilla & Gencarella, LLP

(57) ABSTRACT

A level conversion architecture that accommodates signals traveling between logic blocks operating at corresponding voltage levels is provided. The architecture includes pass gates connected in series between the logic blocks. One of the gates of the pass gates is supplied with a selectable gate voltage supply. The selectable gate voltage supply is selected from a plurality of voltages based on a configuration random access memory (CRAM) setting. In one embodiment, a half latch is connected to one of the pass gates. In this embodiment, the half latch is part of a feedback loop to minimize power leakage of a logic element in one of the logic blocks. A method for managing power consumption and providing voltage level conversion between regions of an integrated circuit is also provided.

23 Claims, 7 Drawing Sheets

PROGRAMMABLE MULTIPLE SUPPLY REGIONS WITH SWITCHED PASS GATE LEVEL CONVERTERS

BACKGROUND

Dual power supplies have been used in low power designs to reduce static and dynamic power. Higher supply voltage ($V_{CCH}$) is typically used for circuits in critical paths, and lower supply voltage ($V_{CCL}$) is used for circuits and non-critical paths. In one embodiment, the higher supply voltage is 1.1 volts, while the lower supply voltage may range between 0.8 and 1.1 volts. It should be appreciated that these voltages are exemplary for core regions of integrated circuits and are not meant to be limiting as the corresponding voltages may be any suitable voltage as long as the relative relationships between the voltages are maintained. With regard to programmable logic devices (PLD), switches are used to select between the higher supply voltage and lower supply voltage. Due to the configurable nature of the programmable logic device, a large number of switches are necessary to accommodate the flexibility provided by the PLD. It should be further appreciated that signals traveling from a $V_{CCL}$ region to a $V_{CCH}$ region need level converters between the two regions in order to avoid a large static current, which occurs when driving a gate in a $V_{CCH}$ region with a gate in a $V_{CCL}$ region.

Level converters have been implemented in various ways. However, common problems encountered include increased delays and relatively large switching currents. With hard wired logic the delays can be minimized as designers know where to place the level converters. When dealing with PLDs, level converters are required at each location where $V_{CCL}$ and $V_{CCH}$ can interface as a designer is unaware beforehand where level converters are needed for different user designs.

Thus, an improved level converter scheme and architecture are needed to minimize delays and contemporaneously reduce power consumption is needed.

SUMMARY

The embodiments described herein provide a level converter that may be incorporated into a programmable logic device without introducing extra delay or requiring greater power consumption. It should be appreciated that the present invention can be implemented in numerous ways, such as a process, an apparatus, a system, a device or a method on a computer readable medium. Several inventive embodiments of the present invention are described below.

In one aspect of the invention, a level conversion architecture that accommodates signals traveling between logic blocks operating at corresponding voltage levels is provided. The architecture includes pass gates connected in series between the logic blocks. One of the gates of the pass gates is supplied with a selectable gate voltage supply. The selectable gate voltage supply is selected from a plurality of voltages based on a configuration random access memory (CRAM) setting. In one embodiment, a half latch is connected to one of the pass gates. In this embodiment, the half latch is part of a feedback loop to minimize power leakage of a logic element in one of the logic blocks.

In another aspect of the invention, a method for managing power consumption and providing voltage level conversion between regions of an integrated circuit is provided. The method includes determining whether an operating voltage level of the regions is at the same level or different levels. If the operating voltage level of the regions is at different levels, then a first voltage level is applied to a gate of a pass gate between the regions and a second voltage level is applied to a gate of a pass gate receiving the output from the first pass gate. The second voltage level is less than the first voltage level. If the operating voltage level of the regions is the same, then depending whether the regions are associated with a $V_{SS}$ or $V_{CC}$ voltage level, the same or different voltages are applied to the gates of the corresponding pass gates. That is, if the regions are associated with $V_{CC}$ voltage, then a boosted voltage is applied to the gates of corresponding pass gates. If the regions are associated with a VSS voltage, then a boosted gate voltage is supplied to one of the pass gates, while the other pass gate receives a voltage corresponding to the voltage level of on of the regions.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a level converter that may be incorporated into a programmable logic device without introducing extra delay or requiring greater power consumption. It will be obvious, however, to one skilled in the art, that the present invention may be practiced without some or all of these specific details. In other instances, well known process operations have not been described in detail in order not to unnecessarily obscure the present invention.

Programmable logic devices are extremely complex devices. The configurable nature of these devices adds to the complexity. The embodiments described herein provide a switched pass gate level converter to partition a programmable logic device into multiple power supply regions without imparting a delay on a critical path. The converter also reduces the total power consumption. As will be described in more detail below, the level conversion scheme takes advantage of some existing architecture in order to minimize the area consumed. In addition, the level converter architecture provided herein reduces/manages power consumption through a feedback loop that incorporates a half-latch and the application of selectable voltage levels to the pass gates routing the signals between regions of the programmable logic device.

Figure 1A:
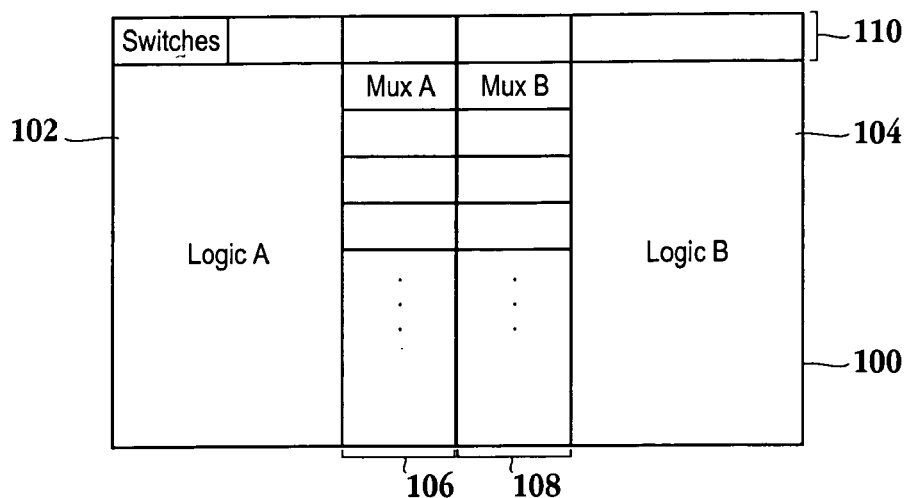
FIG. 1A is a simplified schematic diagram showing a high level view of a programmable logic device (PLD) architecture in accordance with one embodiment of the invention.

FIG. 1A is a simplified schematic diagram showing a high level view of a programmable logic device (PLD) architecture in accordance with one embodiment of the invention. PLD 100 includes logic region A 102 and logic region B 104. Between logic region A 102 and logic region B 104 are multiplexer regions 106 and 108. It should be appreciated that multiplexer regions 106 and 108 provide the flexibility for routing signals between logic region A 102 and logic region B 104. In addition, the signals traveling between logic region A 102 and logic region B 104 may be transmitted between critical paths and non-critical paths. Thus, the signals may be transmitted between regions having different supply voltages. Switches within region 110 provide the flexibility to route the signals through the different paths so that the user can program the paths desired to achieve the functionality suitable for the particular user. The embodiments described herein provide a technique and apparatus for providing power level conversion between the signals traveling from higher supply voltage regions to lower supply voltage regions, and vice versa.

Figure 1B:
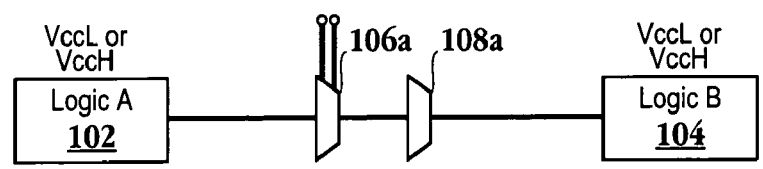
FIG. 1B is a simplified schematic diagram illustrating the signal pathway between logic regions of FIG. 1A in more detail.

FIG. 1B is a simplified schematic diagram illustrating the signal pathway between logic regions of FIG. 1A in more detail. Logic region A 102 may be associated with either a higher supply voltage ($V_{CCH}$) or a lower supply voltage ($V_{CCL}$) depending on the path criticality. The signal will be transmitted to multiplexer 106a and multiplexer 108a, both of which may be associated with a configuration random access memory (CRAM) bit to select a pathway in order to route the signal to logic B region 104.

Figure 2A:
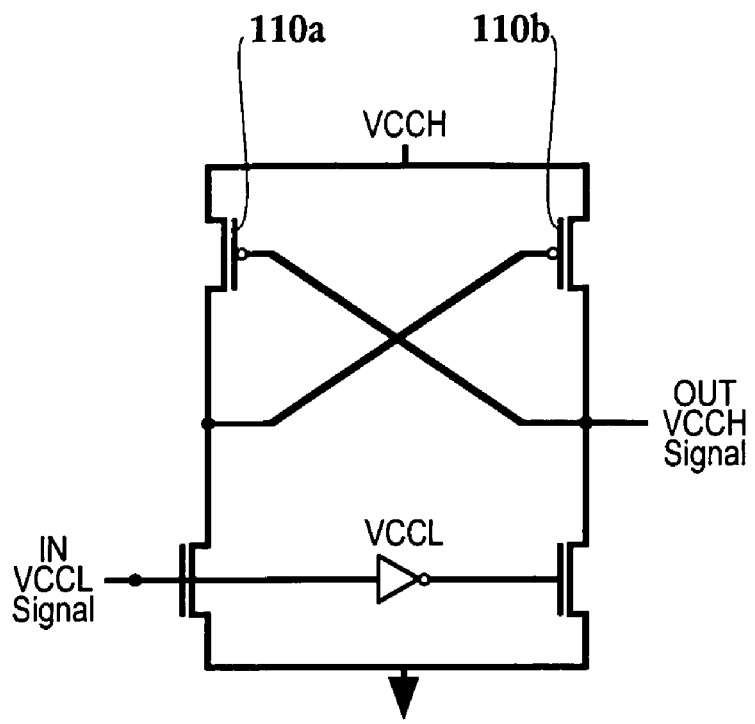
FIGS. 2A and 2B illustrate level converters that may be applied between two regions operating at different voltage levels in order to accommodate transfer of signals from a higher supply voltage to a lower supply voltage, and vice versa.
Figure 2B:
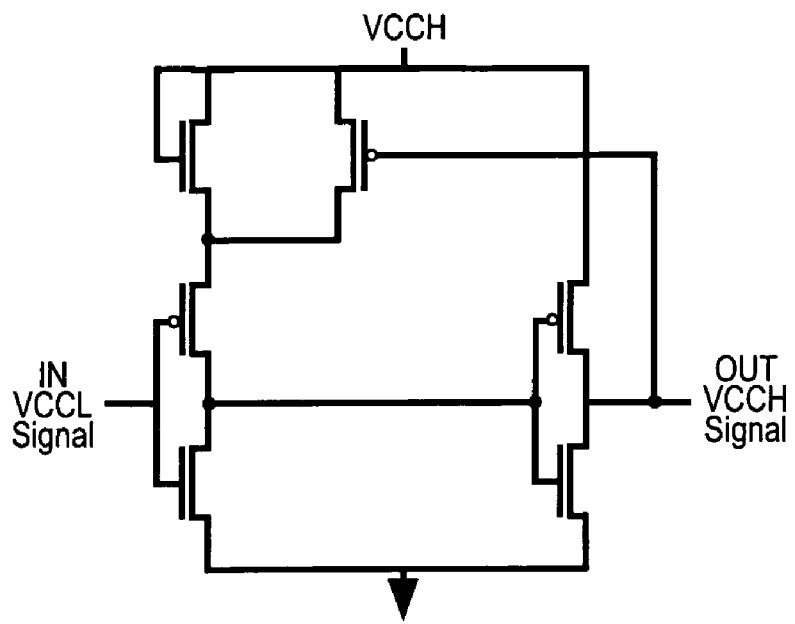

FIGS. 2A and 2B illustrate level converters that may be applied between two regions operating at different voltage levels in order to accommodate transfer of signals from a higher supply voltage to a lower supply voltage, and vice versa. In FIG. 2A, a conventional level converter is illustrated which may be inserted at a $V_{CCH}$ and $V_{CCL}$ interface. It should be appreciated that this type of level converter is associated with a relatively large delay and a large switching current due to a cross coupled p-type metal oxide semiconductor (PMOS) gate 110a and b structure. It should be further appreciated that the level converter of FIG. 2A is also susceptible to leakage. In FIG. 2B an asynchronous level converter with a single supply is illustrated. This type of level converter will consume less power than the level converter of FIG. 2A, as none of the devices in the level converter are partially on when devices are switching. Therefore, the leakage of the level converter in FIG. 2B is less than the leakage for the level converter of FIG. 2A, However, when compared to the level converter of FIG. 2A, the asynchronous level converter of FIG. 2B will have higher delays and switching power due to NMOS and PMOS devices being inserted in series in the first stage of the converter. It should be appreciated that even with $V_{CCH}$ input driving the level converter in FIG. 2B the $V_{CCH}$ region would see the extra delay in switching power due to the NMOS and PMOS circuits being in series in the first stage. With regard to programmable logic devices, since it is not known beforehand where level converters are needed for different user designs, level converters are need at each location where $V_{CCL}$ and $V_{CCH}$ can interface. The embodiments described below illustrate a level converter scheme and architecture that avoids the power consumption and delays associated with the level converters described with regard to FIGS. 2A and 2B.

Figure 3A:
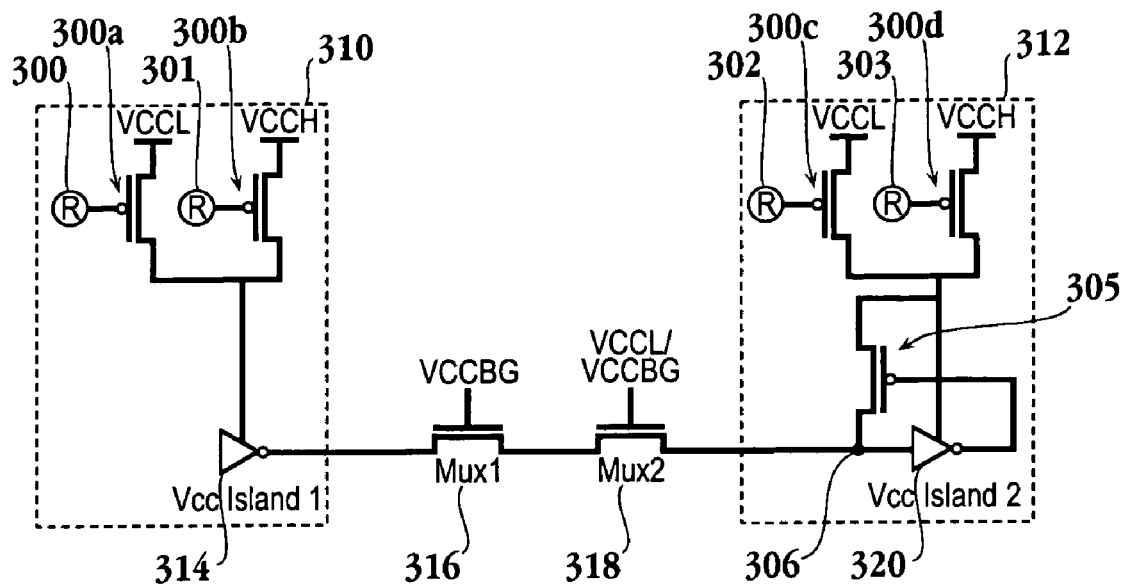
FIG. 3A is a simplified schematic diagram of a two-stage NMOS routing multiplexer and routing driver with a level converter in accordance with one embodiment of the invention.

FIG. 3A is a simplified schematic diagram of a two-stage NMOS routing multiplexer and routing driver with a level converter in accordance with one embodiment of the invention. In the embodiments described herein, in order to minimize any delay due to level converters, a level converter is built onto an existing multiplexer by selecting a proper multiplexer gate voltage. In FIG. 3A, configuration random access memory (CRAM) bits 300, 301, 302 and 303 are used to control the gates of corresponding PMOS transistors 300a-d. One skilled in the art will appreciate that transistors 300a-d correspond to switch region 110 of FIG. 1A. Transistors 300a and 300b within $V_{CC}$ island 1 310 feed inverter 314 which feeds multiplexer 1 316 and then multiplexer 2 318. The signal path then proceeds to inverter 320 through node 306. Half latch 305 is inserted prior to inverter 320. Within $V_{CC}$ island 2 312, the corresponding PMOS transistors 300c and 300d provide a signal to inverter 320 and are in electrical communication with half latch 305. One skilled in the art will appreciate that multiplexer 1 316 and multiplexer 2 318 represent a selected path from many possible paths within the multiplexer region of a PLD.

Continuing with FIG. 3A, activation of PMOS switch 300a, which means CRAM bit 300 is set to a logical low value and CRAM bit 301 is set to a logical high value, results in inverter 314 running off of $V_{CCL}$. Thus, $V_{CC}$ island 1 310 is running at $V_{CCL}$ and for exemplary purposes $V_{CC}$ island 2 312 is running at $V_{CCH}$. Therefore, CRAM bit 302 is set to a logical high value and CRAM bit 303 is set to a logical low value. One skilled in the art will appreciate that the embodiments are not limited to a PMOS type transistors, as NMOS type transistors may also be used with the proper CRAM bit settings to achieve the same functionality described herein. In summary, a low $V_{CC}$ level region driving a high $V_{CC}$ level region in this exemplary embodiment. In order for this converter to function properly, the gate of inverter 320, e.g., node 306, must be at a high enough level to shut off the PMOS transistor of inverter 320 when the input is at a logical high level. The feedback loop that includes PMOS transistor 305 ensures that the value at node 306 is a logical high value in this instance. As used herein, PMOS transistor 305 and corresponding feedback loop may be referred to as a half latch. In addition, multiplexers 316 and 318 may be referred to as pass gates. Furthermore, while these pass gates are illustrated as NMOS type pass gates, a PMOS type pass gate may be substituted accordingly.

As illustrated in FIG. 3A, pass gates 316 and 318 have a selectable power level delivered to the drive the corresponding gates. As described above, when $V_{CC}$ island 2 is operating at $V_{CCL}$, then there is the possibility of the voltage level at node 306 causing a current path going back across pass gates 316 and 318, through inverter 314 and back through PMOS transistor 300a. This reverse path can cause damage to the system and thus needs to be prevented. In order to prevent this reverse current path, the gate of multiplexer 2 318 has the capability to be provided with a selectable voltage, which is illustrated as $V_{CCL}$ and $V_{CCBG}$. $V_{CCBG}$ corresponds to a voltage level that is at least as high, or higher, than $V_{CCH}$. Thus, the gates for multiplexer 1-316 and multiplexer 2-318 are boosted to $V_{CCBG}$, when $V_{CCBG}$ is a higher voltage than $V_{CCH}$. As described above, if NMOS multiplexer gate voltage in both stages, i.e., multiplexer 1 316 and multiplexer 2 318, are boosted, and the $V_{CCL}$ input is driving the structure in $V_{CCH}$, this would cause a DC current flowing from the $V_{CCH}$ side to the $V_{CCL}$ side through a weak PMOS pull-up, and NMOS multiplexers 318 and 316. In addition, the $V_{CCL}$ supply would get pulled above $V_{CCL}$ by the $V_{CCH}$ supply from this reverse current path.

In order to eliminate this reverse path, a gate of the second stage NMOS multiplexer can prevent this if one side of NMOS multiplexer 318 is at $V_{CCL}$ and the other side is at $V_{CCH}$. It should be appreciated that the multiplexer can pass voltages up to $V_{CCL}$ minus $V_{TN}$, where $V_{TN}$ is the voltage threshold of the gate. It should be noted that $V_{CCL}$ gate voltage on multiplexer 2-318 is only required when the $V_{CCL}$ region is driving the $V_{CCH}$ region. When the $V_{CCH}$ region is driving another $V_{CCH}$ region or the $V_{CCL}$ region is driving another $V_{CCL}$ region, there is no need to apply the $V_{CCL}$ gate voltage on multiplexer 2-318. As critical paths are built out of $V_{CCH}$ regions, all NMOS multiplexer gates may be boosted through $V_{CCBG}$, and the paths would not see any extra delay due to the level converters. In one embodiment, non-critical paths and $V_{CCL}$ regions would not have extra delays due to level converters, because all NMOS multiplexer gates would be boosted. In another embodiment, the $V_{CCL}$ region and the $V_{CCH}$ region interfaces are the only place where the extra delay occurs. One skilled in the art will appreciate that if $V_{CCL}$ is greater than $V_{CCH}$ minus $V_{TN}$ of second stage NMOS multiplexer 318, ($V_{CCL}$>$V_{CCH}$-$V_{TN}$), then $V_{CCH}$ may be used to drive the gate NMOS multiplexer 318 rather than $V_{CCBG}$. In this embodiment, the delay at the interface of the $V_{CCL}$ and $V_{CCH}$ regions would be reduced.

Figure 3B:
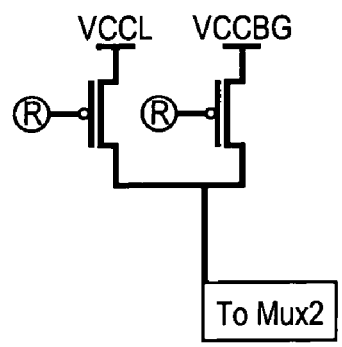
FIG. 3B is a simplified schematic diagram illustrating circuitry for providing the gate of multiplexer 2 of FIG. 3A with either of voltage levels $V_{CCL}$ or $V_{CCBG}$.

FIG. 3B is a simplified schematic diagram illustrating circuitry for providing the gate of multiplexer 2 318 of FIG. 3A with either of voltage levels $V_{CCL}$ or $V_{CCBG}$. It should be appreciated that the selection of $V_{CCL}$ or $V_{CCBG}$ may be achieved through the use of a CRAM bit as illustrated in FIG. 3B. As mentioned previously, the use of PMOS transistors is not meant to be limiting as the same functionality may be provided through a NMOS type resistor and a corresponding CRAM hit level. Of course, $V_{CCH}$ may be used to drive the gate of multiplexer 2 318 if the conditions where $V_{CCL}$>$V_{CCH}$-$V_{TN}$ as discussed above.

Figure 4:
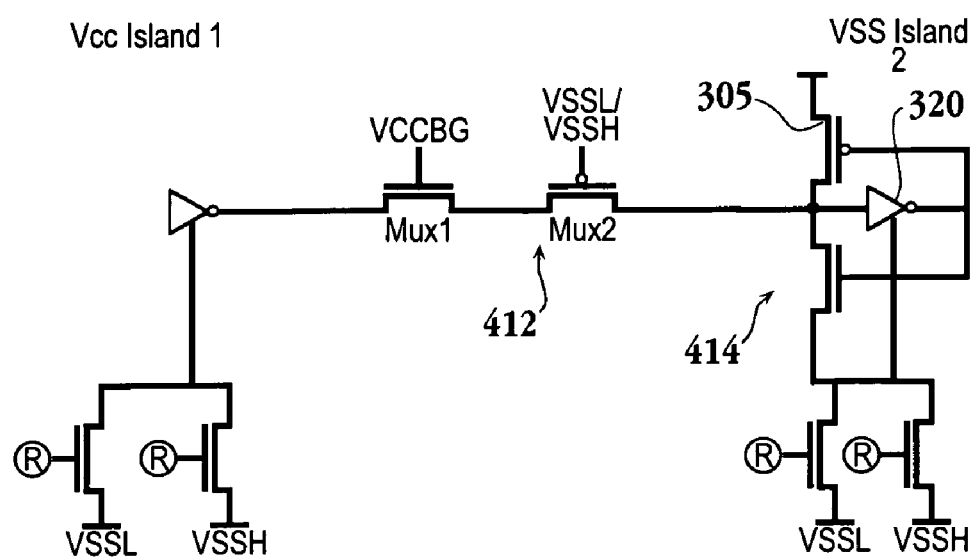
FIG. 4 is a simplified schematic diagram illustrating a two-stage NMOS routing multiplexer and routing driver with a level converter for use with dual $V_{SS}$ supplies in accordance with one embodiment of the invention.

FIG. 4 is a simplified schematic diagram illustrating a two-stage NMOS routing multiplexer and routing driver with a level converter for use with dual $V_{SS}$ supplies in accordance with one embodiment of the invention. FIG. 4 illustrates an alternative to FIG. 3A, where the PMOS switches 300a-d for dual $V_{CC}$ supplies are substituted with NMOS switches with dual $V_{SS}$ supplies, i.e., $V_{SSL}$ and $V_{SSH}$. It should be appreciated that since NMOS switches are about half the size of PMOS switches, using NMOS switches results in an area savings. In the embodiment of FIG. 4, multiplexer 2 412 is a PMOS switch. This prevents a DC path between $V_{SSL}$ and $V_{SS}$ island 1 and $V_{SSH}$ in $V_{SS}$ island 2. In FIG. 4, NMOS pull-down transistor 414 is positioned at the input of routing driver 320 to compensate for the PMOS voltage threshold drop across the second stage PMOS multiplexer 412. PMOS transistor 305 functions to prevent a reverse current path as described above. The gate of multiplexer 2 412 is provided with the capability of being supplied with either voltage level $V_{SSL}$ or $V_{SSH}$. It should be noted that the structure provided in FIG. 3B may be modified to achieve this functionality for the embodiment of FIG. 4. One skilled in the art will appreciate that while the examples provided in FIGS. 3 and 4 have been described for two $V_{CC}$/$V_{SS}$ regions, this is not meant to be limiting as each of these embodiments can be extended to more than two $V_{CC}$/$V_{SS}$ regions as needed. Furthermore, it will be apparent to one skilled in the art that multiple routing drivers may exist in each $V_{SS}$$V_{CC}$ island and the embodiments are not limited to a single routing driver as illustrated in FIGS. 3A and 4.

Figure 5:
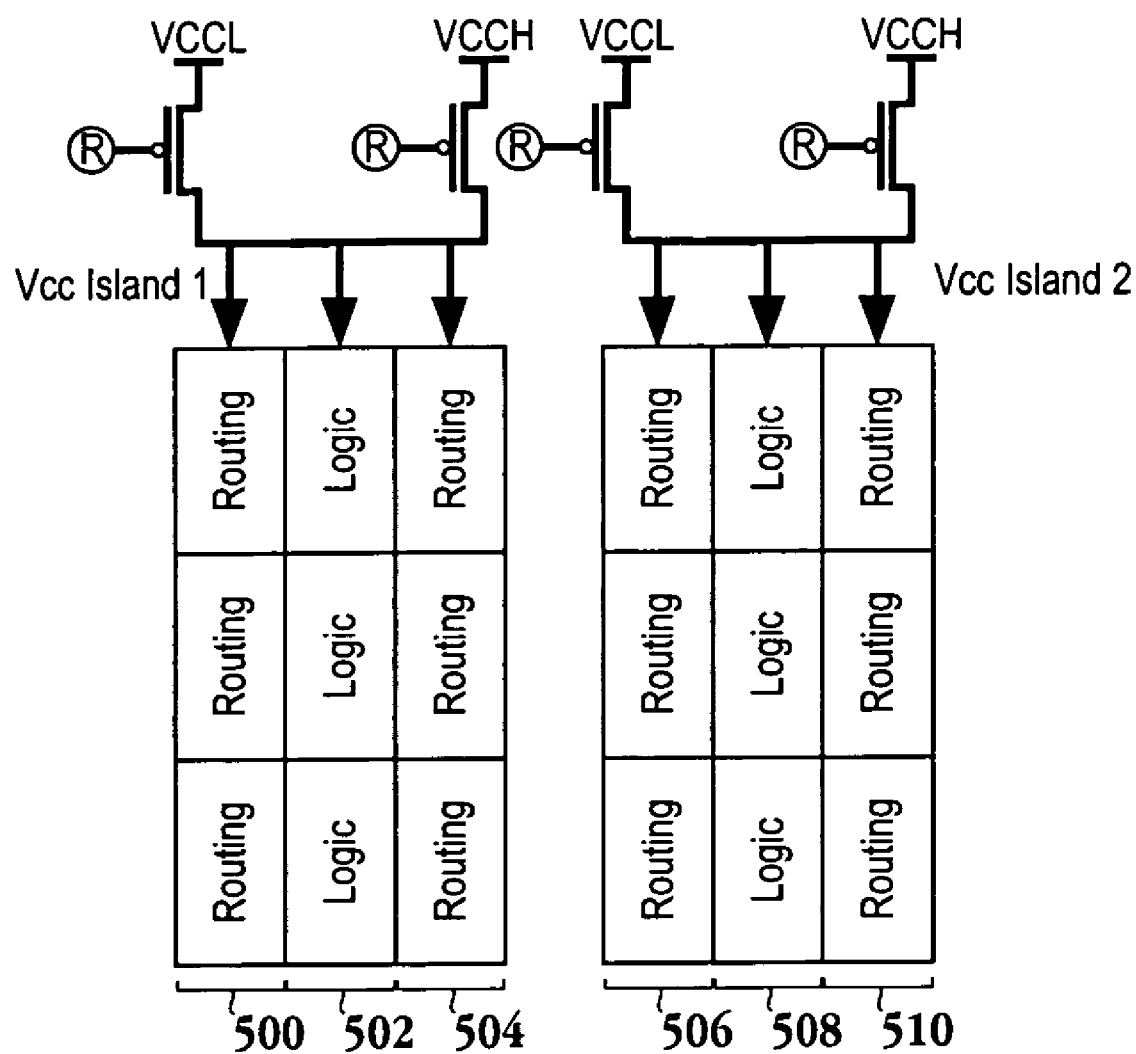
FIG. 5 is a top-level representation of multiple $V_{CC}$ islands in accordance with one embodiment of the invention.
Figure 6:
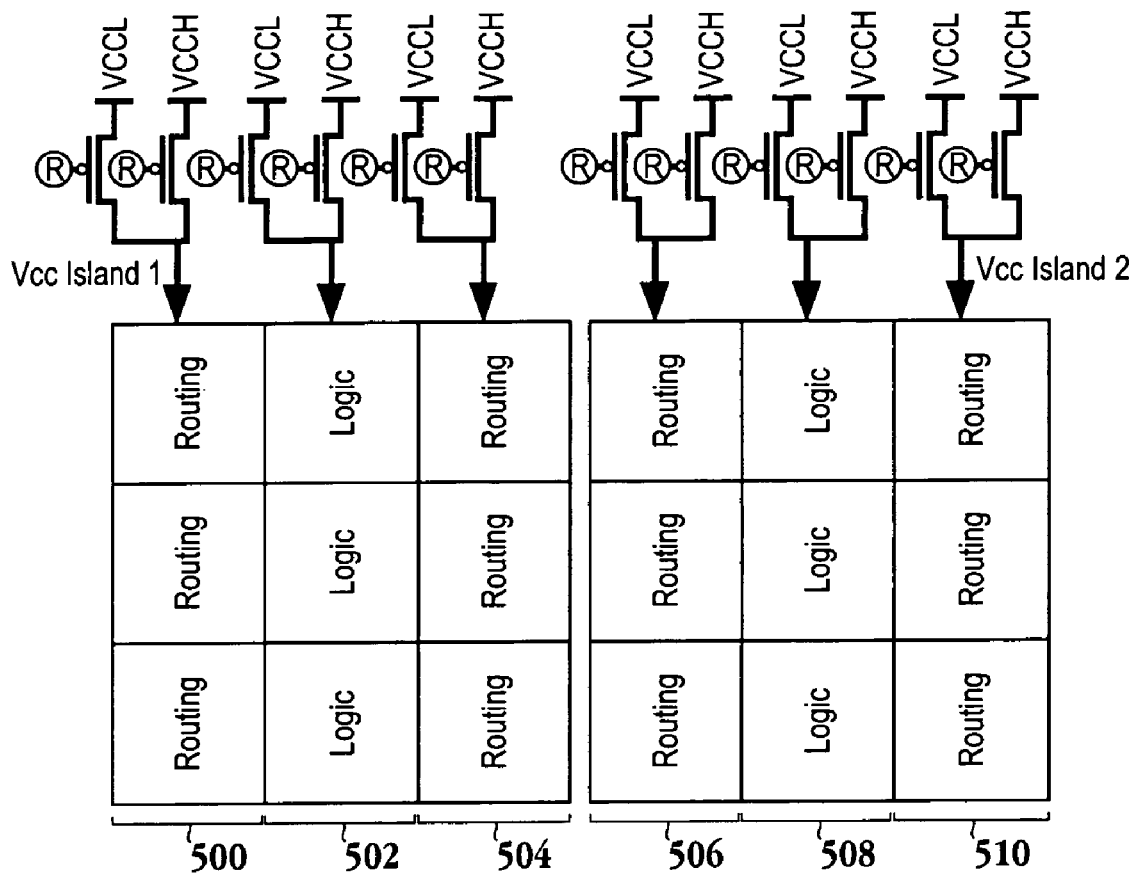
FIG. 6 is an alternative representation of the top-level illustration of FIG. 5.
Figure 7:
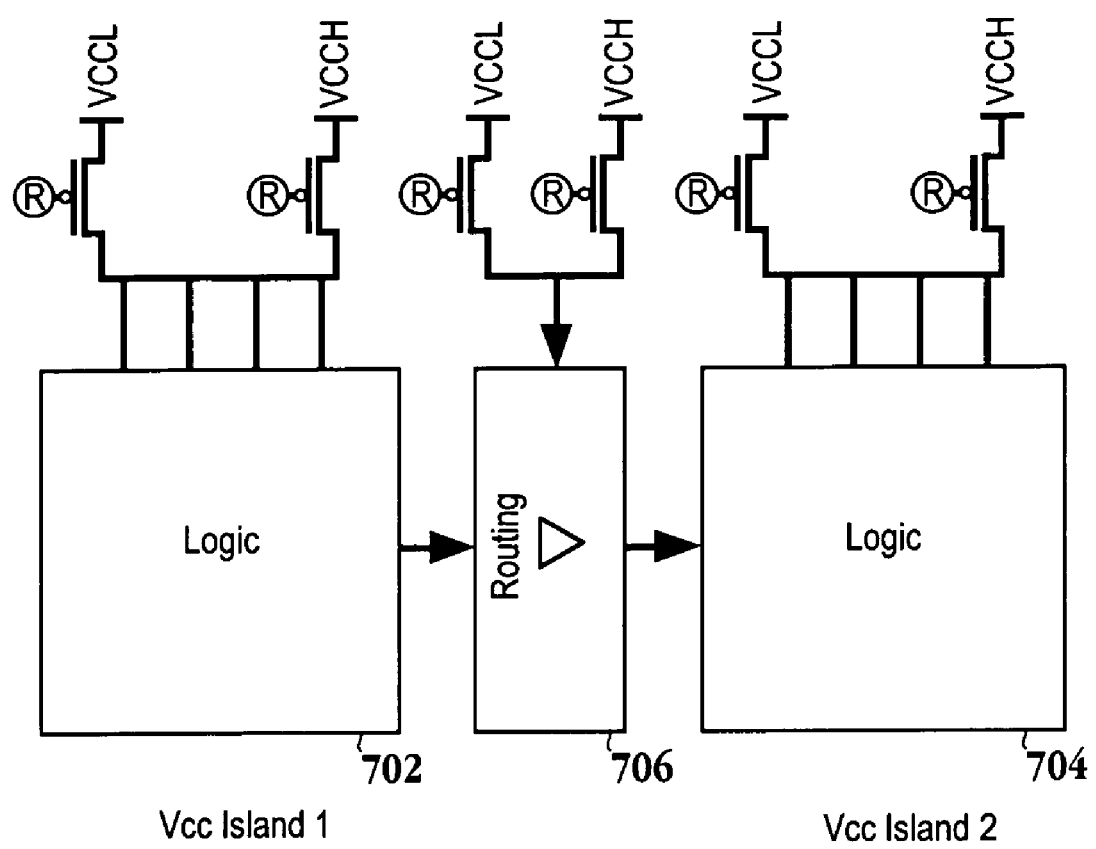
FIG. 7 is a simplified schematic diagram illustrating further details of the embodiment of FIG. 6 where a partitioning of multiple $V_{CC}$ islands in an arithmetic logic element is done in accordance with one embodiment of the invention.

FIG. 5 is a top-level representation of multiple $V_{CC}$ islands in accordance with one embodiment of the invention. In FIG. 5, regions 500, 502, and 504 are included in $V_{CC}$ island 1, while regions 506, 508, and 510 are included in $V_{CC}$ island 2. Thus, the PLD is partitioned into different $V_{CC}$ regions and in this embodiment as the $V_{CCL}$ and $V_{CCH}$ supplies are shared among multiple blocks, the area required for the switches is minimized. Alternatively, in FIG. 6 each of regions 500 through 510 is associated with a dedicated $V_{CCL}$ and $V_{CCH}$ supply switch. FIGS. 5 and 6 illustrate that based on different speed and power tradeoffs, the programmable logic device can be partitioned differently. FIG. 7 is a simplified schematic diagram illustrating further details of the embodiment of FIG. 6 where a partitioning of multiple $V_{CC}$ islands in an arithmetic logic element is done in accordance with one embodiment of the invention. The partitioning within arithmetic logic element (ALE) includes separate level converters from the routing level converters. Here, VCC island 1 702 and VCC island 2 704 can be configured to four different regions based on device speed and power requirements. As the logic blocks 702 and 704 and routing block 706, form a single block, these blocks can be configured with similar or different $V_{CC}$ levels, in which ever mode they are operating as per power requirements specify.

It should be appreciated that the routing drivers can be operated in different $V_{CC}$ islands based on speed and power tradeoff requirements. The routing drivers can be segmented into four different cases of $V_{CC}$. The four cases cover propagation of signals to and from $V_{CC}$ islands, which include Case one—($V_{CCL}$→$V_{CCL}$), Case two—($V_{CCH}$→$V_{CCH}$), Case three—($V_{CCH}$→$V_{CCL}$), and Case 4—($V_{CCL}$→$V_{CCH}$) as described below. In case one, a signal associated with a $V_{CCL}$ island is being transmitted to a similar $V_{CCL}$ island. In this low power mode, both drivers are in $V_{CCL}$ islands by configuring the corresponding RAM bits on the PMOS transistors e.g., transistors 300-03 of FIG. 3A, and the first and second stage multiplexers, e.g., multiplexers 316 and 318 of FIG. 3A, are driven by a boosted gate voltage ($V_{CCBG}$). In case two, sometimes referred to as the regular mode of operation for the critical path network, wherein both the drivers are in $V_{CCH}$ islands the corresponding RAM bits on PMOS transistors in the first and second stage multiplexers are driven by a boosted gate voltage. In case three, which is required for the routing drivers to switch from critical path to non-critical path, the corresponding RAM bits on PMOS are configured for $V_{CC}$ island 1 and 2. Here, the first stage multiplexer is driven by $V_{CCBG}$ and the second stage multiplexer is driven by VCCL to prevent shorts between $V_{CC}$ island 1 and $V_{CC}$ island 2. In case four, which is very much similar to case three, except that the routing driver switches from non-critical path to a critical path mode, the corresponding RAM bits on PMOS are configured for $V_{CC}$ island 1 and 2 and the first and second stage multiplexers are driven by $V_{CCBG}$ and $V_{CCL}$, respectively, to prevent shorts between the $V_{CC}$ islands. It should be appreciated that the exemplary discussion provided with reference to FIG. 3A uses settings of case four. As mentioned above, $V_{CCBG}$ is at least as high as $V_{CCH}$.

In summary, the level converter architecture for the PLD provides a power management solution that reduces power without impacting the critical path delay. In one embodiment, a gate of one of the multiple pass gates is capable of receiving a selectable voltage level in order to prevent a reverse current path in certain instances. In another embodiment, a half latch is provided to assist in ensuring minimal power consumption/losses.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

As used herein programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A level conversion architecture for accommodating signals traveling between logic blocks operating at corresponding voltage levels, comprising;
   at least two pass gates connected in series between the logic blocks;
   a selectable gate voltage supply provided through a transistor to a gate of one of the at least two pass gates;
   a half latch connected to the one of the at least two pass gates, wherein the half latch is part of a feedback loop to minimize power leakage of a logic element in one of the logic blocks; and
   an inverter coupled to one of the at least two pass gates and the half latch, the inverter driven by a selectable voltage level, the selectable voltage level supplied to a supply terminal of the half latch.

2. The level conversion architecture of claim 1, wherein the one of the at least two pass gates is a last pass gate located prior to the logic element.

3. The level conversion architecture of claim 1, wherein the logic blocks are associated with one of a non-critical path or a critical path, the critical path operating at a higher voltage level than the non-critical path.

4. The level conversion architecture of claim 1, wherein the half latch includes a P-type metal oxide semiconductor (PMOS) transistor.

5. The level conversion architecture of claim 1, wherein the selectable gate voltage supply is one of the corresponding voltage levels and another voltage level that is greater than any of the corresponding voltage levels.

6. The level conversion architecture of claim 1, wherein the at least two pass gates are N-type metal oxide semiconductor (NMOS) pass gates.

7. The level conversion architecture of claim 1, wherein the selectable gate voltage supply is supplied according to a configuration random access memory (CRAM) bit setting supplied to a gate of a transistor.

8. The level conversion architecture of claim 7, wherein the transistor is a PMOS transistor.

9. The level conversion architecture of claim 1 wherein the architecture is incorporated into a programmable logic device.

10. A programmable logic device, comprising;
    a first region operating at a first voltage;
    a second region operating at a second voltage;
    multiple pass gates connecting the first and the second region, wherein a gate of one of the multiple pass gates has a selectable voltage supply from a plurality of voltages based on a configuration random access memory (CRAM) setting, the selectable voltage supply passing through a transistor to the gate, wherein the second region includes an inverter coupled to one of the at least two pass gates and a half latch of the second region, the inverter driven by a selectable voltage level, the selectable voltage level supplied to a supply terminal of the half latch.

11. The programmable logic device of claim 10, wherein the plurality of voltages includes one of the first or the second voltage and a third voltage greater than either of the first or the second voltage.

12. The programmable logic device of claim 10, wherein the selectable voltage level is controlled through a configuration random access memory (CRAM) bit.

13. The programmable logic device of claim 12, wherein the half latch is part of a feedback loop defined between an output of the logic element and an input into the logic element.

14. The programmable logic device of claim 10, wherein the CRAM setting opens one of a plurality of transistors to enable supply of the selectable voltage.

15. The programmable logic device of claim 10, wherein the first voltage is less than the second voltage and the selectable voltage supplied to the one of the multiple pass gates is the first voltage.

16. The programmable logic device of claim 10, wherein remaining gates of the multiple pass gates are supplied a third voltage that is greater than either the first or the second voltage.

17. The programmable logic device of claim 10, wherein each of the first region and the second region correspond to one of $V_{cc}$ regions or $V_{ss}$ regions.

18. The programmable logic device of claim 17, wherein if each of the first region and the second region correspond to $V_{ss}$ regions, then the one of the multiple pass gates is a PMOS pass gate.

19. A method for managing power consumption and providing voltage level conversion between regions of an integrated circuit, comprising method operations of:

determining whether an operating voltage level of the regions is a same level or different levels;

if the operating voltage level of the regions is different, then the method includes, applying a first voltage level to a gate of a first pass gate on a path between the regions;

applying a second voltage level through a transistor to a gate of a second pass gate receiving output from the first pass gate, the second voltage level being less than the first voltage level; and setting a configuration random access memory (CRAM) bit to enable a transistor to allow the second voltage level to be supplied to both an inverter receiving output from the second pass gate and a supply terminal of a half latch coupled to the inverter.

20. The method of claim 19, wherein the method operation of applying a first voltage level to a gate of a first pass gate on a path between the regions includes, setting another configuration random access memory (CRAM) bit to enable another transistor to allow the first voltage level to be supplied to the gate of the first pass gate.

21. The method of claim 19, wherein the first voltage level is greater than any operating voltage level of the regions.

22. The method of claim 19, further comprising:

if the operating voltage level of the regions is a same level, then the method includes, applying a same voltage level to the gate of the first pass gate and the gate of the second pass gate, wherein the same voltage level is greater than any operating voltage level of the regions.

23. The method of claim 19, further comprising:

if the operating voltage level of the regions is a same level, then the method includes, applying a first voltage level to a gate of a first pass gate on a path between the regions, the first voltage level being greater than any operating voltage level of the regions; and applying a second voltage level to a gate of a second pass gate receiving output from the first pass gate, the second voltage level being selected from one of the operating voltage levels of the regions.

* * * * *